United States Patent
Terada et al.

(10) Patent No.: US 7,923,926 B2
(45) Date of Patent: Apr. 12, 2011

(54) ORGANIC ELECTROLUMINESCENT PANEL AND ORGANIC ELECTROLUMINESCENT DISPLAY DEVICE

(75) Inventors: Kohsuke Terada, Tenri (JP); Haruyuki Morita, Yamatokoriyama (JP); Akira Tagawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 388 days.

(21) Appl. No.: 12/095,045

(22) PCT Filed: Nov. 30, 2006

(86) PCT No.: PCT/JP2006/323977
§ 371 (c)(1),
(2), (4) Date: May 27, 2008

(87) PCT Pub. No.: WO2007/066573
PCT Pub. Date: Jun. 14, 2007

(65) Prior Publication Data
US 2009/0278443 A1    Nov. 12, 2009

(30) Foreign Application Priority Data

Dec. 5, 2005 (JP) ................................. 2005-350640
Nov. 20, 2006 (JP) ................................. 2006-313161

(51) Int. Cl.
*H01J 1/62* (2006.01)
(52) U.S. Cl. ...................................... 313/509; 313/503
(58) Field of Classification Search ........... 313/503–512
See application file for complete search history.

(56) References Cited

U.S. PATENT DOCUMENTS

| 6,768,259 | B2 | 7/2004 | Hirano | |
| 6,956,240 | B2 * | 10/2005 | Yamazaki et al. | 257/79 |
| 7,452,257 | B2 * | 11/2008 | Tsuchiya et al. | 445/24 |
| 7,474,375 | B2 * | 1/2009 | Kwak et al. | 349/153 |
| 2003/0116772 | A1 * | 6/2003 | Yamazaki et al. | 257/83 |
| 2004/0246432 | A1 | 12/2004 | Tsuchiya et al. | |
| 2005/0195355 | A1 | 9/2005 | Kwak et al. | |

FOREIGN PATENT DOCUMENTS

| JP | 10-189252 A | 7/1998 |
| JP | 2001-196188 A | 7/2001 |
| JP | 2004-152542 A | 5/2004 |
| JP | 2004-241247 A | 8/2004 |
| JP | 2005-26103 A | 1/2005 |
| JP | 2005-141960 A | 6/2005 |
| JP | 2005-164818 A | 6/2005 |
| JP | 2006-66206 A | 3/2006 |

OTHER PUBLICATIONS

Official communication issued in the International Application No. PCT/JP2006/323977, mailed on Mar. 6, 2007.

* cited by examiner

*Primary Examiner* — Peter Macchiarolo
(74) *Attorney, Agent, or Firm* — Keating & Bennett, LLP

(57) ABSTRACT

An organic electroluminescent panel has excellent reliability of luminance of emitted light, and an organic electroluminescent display device includes such an organic electroluminescent panel. The organic electroluminescent panel includes a structure in which the first electrode, an organic layer including at least a light-emitting layer, the second electrode are stacked in this order on a substrate having a surface on which an organic insulating film is formed, wherein the organic electroluminescent panel further includes an inorganic insulating film, the inorganic insulating film covers the organic insulating film and the first electrode, the inorganic insulating film has an opening in a display region and an opening in a non-display region, and the opening in the display region is formed on the first electrode.

12 Claims, 8 Drawing Sheets

41  42

ORGANIC ELECTROLUMINESCENT PANEL AND ORGANIC ELECTROLUMINESCENT DISPLAY DEVICE

BACKGROUND OF THE INVENTION

1. Field of the Invention

The present invention relates to an organic electroluminescent panel and an organic electroluminescent display device. More specifically, the present invention relates to an organic electroluminescent panel having a structure in which an organic electroluminescent element is arranged above a thin film transistor, a wiring, and the like with an insulating film therebetween; and an organic electroluminescent display device including the organic electroluminescent panel.

2. Description of the Related Art

An organic electroluminescent (hereinafter, also referred to as an "organic EL") display device is a display device which includes an organic EL panel, and the organic EL panel includes self-emitting elements, i.e., organic EL elements arrayed as a light source. This organic EL display device has an advantageous structure in principle, for example, in terms of reduction in thickness and weight, improvement in viewing angle and moving image characteristics, and decrease in electric power consumption and the number of components, although it still has room for improvement in extension of lifetime of the organic EL element and increase in size of the display, and the like. Therefore, the organic EL display device is a very promising next-generation thin display device, and therefore it has been actively researched and developed to be practically and widely used.

Further, high-definition images can be displayed in a display device including many pixels, such as a TV and a monitor, and therefore, in such a display, an active matrix system is commonly used for controlling driving of the pixels. According to the active matrix system, a thin film transistor (hereinafter, also referred to as a "TFT") is formed in each of pixels arranged in a matrix pattern, and by switching this TFT using a control signal, a voltage applied to the respective pixels is controlled and thereby images are displayed. However, according to the active matrix system, the TFT and wirings connected thereto need to be arranged in each of the pixels, and therefore, a proportion of an area of the display region relative to an area of the entire pixel region, that is, an aperture ratio is reduced.

As a method for increasing the aperture ratio, a structure in which an interlayer insulating film for flattening is formed to cover the TFT and the wirings, and on this interlayer insulating film, organic EL elements are formed, is effective in an active matrix organic EL panel (for example, refer to Patent Document 1). The Patent Document 1 discloses a polyimide coating film, and a $SiO_2$ film as the interlayer insulating film. An organic material is preferably used as a material for the interlayer insulating film, commonly. This is because the use of the organic material is advantageous for the interlayer insulating film to secure a thickness larger than a specific thickness, in terms of simplification of production processes, reduction in production costs, and the like. However, the organic material easily absorbs moisture. Therefore, such an interlayer insulating film composed of an organic material has been known to have influences such as a reduction in luminance of light emitted from the organic EL element.

For this problem, a method of preventing the influences on the organic EL element by a configuration in which the organic insulating film is covered with an inorganic insulating film is disclosed (for example, refer to Patent Documents 2 to 4). A method in which the substrate is heated or placed under a vacuum atmosphere to be subjected to a dehydration treatment, thereby preventing influences of residual moisture on the organic EL element is disclosed (for example, refer to Patent Document 5). However, even if these methods are used, pixel shrinkage (refer to FIG. 4), i.e., a problem in which a luminance of emitted light is reduced with time, starting from the peripheral part of the display region of the organic EL panel, can not be completely prevented. Therefore, such methods still have room for improvement.

Patent Document 1: Japanese Kokai Publication No. Hei-10-189252
Patent Document 2: Japanese Kokai Publication No. 2001-356711
Patent Document 3: Japanese Kokai Publication No. 2005-26103
Patent Document 4: Japanese Kokai Publication No. 2004-241247
Patent Document 5: Japanese Kokai Publication No. 2001-196188

SUMMARY OF THE INVENTION

In order to overcome the problems described above, preferred embodiments of the present invention provide an organic EL panel that is excellent in reliability of the luminance of emitted light, and an organic EL display device including the organic EL panel.

The present inventor made various investigations of an organic EL panel including organic EL elements on a substrate having a surface on which an organic insulating film is formed. The inventor noted the following. The organic insulating film includes a material which easily absorbs moisture, and therefore moisture remaining in the organic insulating film enters the organic EL elements and often influences light emission characteristics of the organic EL elements. Further, the reliability of the luminance of emitted light can not be sufficiently obtained only by the conventional measures, for example, by arranging the inorganic insulating film on the organic insulating film, or by dehydrating the organic insulating film in production steps of the organic EL panel. For example, even if an active matrix organic EL panel is prepared through the following steps: (1) an organic insulating film is formed to cover TFTs and wirings; (2) organic EL elements are formed on this organic insulating film; (3) in order to prevent leakage between the first electrode (the lower electrode) and the second electrode (the upper electrode) of the organic EL element, an inorganic insulating film is formed on the interlayer insulating film to have an opening at a light-emitting portion of the organic EL element and surround the periphery of the first electrode; and (4) the organic insulating film is subjected to a dehydration treatment in order to prevent influence of moisture contained in the organic insulating film, the pixel shrinkage (refer to FIG. 4), i.e., the problem in which the luminance of emitted light is reduced with time, starting from the peripheral portion of the display region, is generated.

Then, the present inventor made further investigations and found that according to the above-mentioned dehydration treatment (4), moisture in the organic insulating film in the display region can be sufficiently removed, but moisture in an amount large enough to influence the organic EL elements remains in the organic insulating film in a non-display region, and this causes the reduction in luminance, which starts from the peripheral portion of the display region. Further, the inventor discovered the following: a difference between the display region and the non-display region is the existence of the opening of the inorganic insulating film formed on the organic insulating film; and if the inorganic insulating film completely covers the organic insulating film, the dehydration effect is insufficient; and if the opening is formed in the inorganic insulating film, the dehydration effect can be sufficiently obtained. Thus, the present inventor discovered the following: moisture contained in the organic insulating film can be dehydrated in the entire panel if the inorganic insulating film covers the organic insulating film and the first electrode and the inorganic insulating film has an opening in a display region and an opening in a non-display region and the opening in the display region is formed on the first electrode. As a result, the pixel shrinkage in the organic EL panel can be prevented. Therefore, an organic EL panel with high reliability can be prepared. As a result, the above-mentioned problems have been admirably solved, leading to completion of preferred embodiments of the present invention.

That is, a preferred embodiment of the present invention provides an organic electroluminescent panel including a structure in which a first electrode, an organic layer including at least a light-emitting layer, a second electrode are stacked in this order on a substrate having a surface on which an organic insulating film is formed, wherein the organic electroluminescent panel further includes an inorganic insulating film, the inorganic insulating film covers the organic insulating film and the first electrode, the inorganic insulating film has an opening in a display region and an opening in a non-display region, and the opening in the display region is formed on the first electrode.

The organic EL panel according to a preferred embodiment of the present invention has a structure in which the first electrode, an organic layer including at least a light-emitting layer, and the second electrode are stacked in this order on a substrate having a surface on which an organic insulating film is formed. That is, the organic EL panel according to a preferred embodiment of the present invention includes an organic EL element on the substrate having a surface on which an organic insulating film is formed. The organic EL element has a structure in which an organic layer (organic EL layer) such as a light-emitting layer, a positive hole transport layer, a positive hole injection layer, and an electron transport layer is interposed between a pair of electrodes. By applying a voltage between the pair of electrodes, the organic EL element emits light. According to the organic EL panel, each pixel including the organic EL element needs at least two TFTs, i.e., a switching TFT and a driving TFT in order to be driven. Further, wirings, and driving circuits (drivers) which are used to control the respective pixels when the organic EL panel is used in a display device are arranged. Accordingly, in according with a preferred embodiment of the present invention, an active matrix substrate in which a plurality of TFTs and signal lines are formed on a substrate and an organic insulating film is formed to cover the TFTs and signal lines is preferably used as the above-mentioned substrate having a surface on which an organic insulating film is formed.

The above-mentioned organic insulating film is not especially limited as long as it is an insulating film including an organic material. The organic insulating film has functions as an interlayer insulating film, that is, a function of separating the organic EL element from the TFT, the wirings, and the like formed on the substrate. The organic insulating film needs to be formed both in the display region where the first electrode, the organic layer, and the second electrode of the organic EL element are formed and in the non-display region where the driver is formed, in order to separate the above-mentioned TFT, wiring, driving circuit, and the like, from the electrodes included in the organic EL element. If the organic insulating film is formed, an uneven substrate surface, due to formation of the TFT, the wiring, and the like, can be flattened, and therefore the organic EL element can be easily formed. Further, by forming the organic insulating film, the TFT, the wiring, and the like can be formed on the substrate to be close to or overlap with the organic EL element as viewed in a plane. As a result, the aperture ratio can be improved.

The organic EL panel according to a preferred embodiment of the present invention includes an inorganic insulating film. The inorganic insulating film covers the organic insulating film and the first electrode, and has an opening in a display region and an opening in a non-display region. The opening in the display region is formed on the first electrode. According to conventional technology, the inorganic insulating film is formed in order to prevent moisture remaining in the organic insulating film from influencing the organic EL element. However, according to a preferred embodiment of the present invention, the aim to form the inorganic insulating film is not to shield moisture contained in the organic insulating film positioned below the first electrode of the organic EL element. The first aim of the inorganic insulating film according to a preferred embodiment of the present invention is to prevent defects caused by leakage at the edge of the first electrode between the first electrode and the second electrode of the organic EL element, by covering the first electrode and including an opening on the first electrode. The second aim is to suppress impurities from diffusing into the organic EL element from the organic insulating film positioned below the organic EL element. The third aim is to prevent the organic insulating substance from being decomposed and eliminated by UV cleaning and the like, and prevent pollution of the substrate by redeposition. The fourth aim is to prevent a short circuit between the wirings positioned below a sealing portion, described in more detail below, where a sealing member is attached. The fifth aim is to use the inorganic insulating film as a bank for saving liquid if the organic layers are formed by a coating method using a liquid material such as an ink-jet method.

The organic insulating film might absorb moisture through the interface with another film, the end surface of the film, a pin hole, and the like, even if it is covered with the first electrode and the inorganic insulating film. For example, the organic insulating film might absorb moisture when a photoresist is subjected to a separation and washing process in a step of forming the electrode by patterning. The inorganic insulating film according to a preferred embodiment of the present invention also preferably has an opening in the non-display region (hereinafter, also referred to as the second opening) in addition to the opening formed on the first electrode in the display region (hereinafter, also referred to as the first opening). Due to the second opening, moisture remaining in the organic insulating film in the non-display region also can be sufficiently reduced by a dehydration treatment. As a result, the reduction in luminance, which starts from the peripheral portion of the display region, can be prevented, and therefore, the reliability of the luminance of emitted light in the organic EL panel can be improved.

In a preferred embodiment of the present invention, the display region is a region where a plurality of pixels each including the organic EL element are arranged. The display region is used as a display screen in an organic EL display device. In the non-display region, wirings, and driving circuits (drivers) which are used to control the respective pixels when the organic EL panel is used in a display device are arranged.

In a preferred embodiment of the present invention, the first and second openings of the inorganic insulating film mean a region where the inorganic insulating film is not formed. The shape, size, and number of the opening, and a distance between the openings are not especially limited. The first and second openings may have the same configuration. The second opening may be a notch (depression) formed in the peripheral portion of the inorganic insulating film, or may be the entire region on the organic insulating film in the non-display region.

The above-mentioned inorganic insulating film is not especially limited as long as it is an insulating film including an inorganic material. It is preferable that the inorganic insulating film has an etching selectivity relative to an electrode film. That is, it is preferable that the inorganic insulating film is etched at a rate higher than a rate for etching of the electrode film, by appropriately selecting an etchant for etching the inorganic insulating film. Examples of such an inorganic insulating film include a silicon oxide film, a silicon nitride film, an aluminum oxide film, an aluminum nitride film, and a tantalum pentoxide film. A film including a material constituting other components of the organic EL panel is preferable as the above-mentioned inorganic insulating film because the common material and equipment can be used. Silicon oxide, silicon nitride, and the like may be mentioned as the material.

The configuration of the organic EL panel according to preferred embodiments of the present invention is not especially limited as long as it essentially includes such components. The organic EL panel may include other components.

It is preferable that an area of the opening of the inorganic insulating film in the non-display region accounts for about 10% or more relative to an area of a region where the organic insulating film is formed in the non-display region. According to such a structure, moisture remaining in the organic insulating film in the non-display region can be more sufficiently reduced by a dehydration treatment. Therefore, the reduction in luminance, which starts from the peripheral portion of the display region, can be more effectively prevented, and therefore the reliability of the luminance of emitted light in the organic EL panel can be more improved. The lower limit of the proportion of the area of the second opening relative to the region where the organic insulating film is formed in the non-display region is more preferably about 20% and the upper limit thereof is preferably about 80%.

It is preferable that the organic electroluminescent panel further includes a protective film, and the protective film is formed below the opening of the inorganic insulating film in the non-display region. According to such a structure, the organic insulating film can be protected when the opening of the inorganic insulating film is formed by an etching and the like. As a result, the production yield of the organic EL panel can be improved. Further, a capacitance between the second electrode, and the drivers and the wirings, can be adjusted by appropriately selecting the material, thickness, shape, pattern and the like of the protective film if the protective film in the non-display region is formed between the drivers and the wirings positioned below the organic insulating film, and the second electrode positioned above the organic insulating film.

According to a preferred embodiment in which the protective film is formed below the opening of the inorganic insulating film in the non-display region, if the protective film has a low permeability, the protective film inhibits moisture contained in the organic insulating film from being released out of the opening of the inorganic insulating film from the organic insulating film through the protective film. Accordingly, the following preferred embodiments (A) and (B) are preferable: (A) the inorganic insulating film has a plurality of openings in the non-display region, the protective film is formed below each one of the openings of the inorganic insulating film in the non-display region to cover the organic insulating film positioned below the opening; and (B) the protective film has an opening (including a notch formed in the outer periphery). According to the preferred embodiments (A) or (B), moisture contained in the organic insulating film can be efficiently removed out of the opening of the inorganic insulating film through the portion where the protective film is not formed and the interface between the protective film and the inorganic insulating film.

According to the preferred embodiment (B), the opening of the protective film may be formed below the opening of the inorganic insulating film or may be formed in a region other than the region below the opening of the inorganic insulating film. If the organic insulating film can not be sufficiently dehydrated because the protective film is formed over the entire region below the opening of the inorganic insulating film, it is preferable that the protective film has an opening below the opening of the inorganic insulating film in the non-display region. It is preferable that an area of the opening of the protective film accounts for about 10% or more relative to an area of a region where the organic insulating film is formed in the non-display region. The lower limit of the proportion of the area of the opening of the protective film relative to the area of the region where the organic insulating film is formed in the non-display region is more preferably 20%, and the upper limit thereof is preferably 80%.

Other preferred embodiments of the above-mentioned protective film having the opening include a preferred embodiment in which the protective film having the opening is arranged on a conductive member such as a wiring, formed on the above-mentioned substrate having a surface on which the organic insulating film is formed. That is, it is preferable that the protective film has no opening above the conductive member in order to sufficiently cover the conductive member such as a wiring arranged below the organic insulating film.

The material for the above-mentioned protective film is not especially limited as long as it can protect the organic insulating film when the opening of the inorganic insulating film is formed. That is, a material having an etching selectivity relative to the inorganic insulating film, (a material which enables the inorganic insulating film to be etched at a rate higher than a rate for etching of the protective film, by appropriately selecting an etchant for etching the inorganic insulating film) is preferable. An electrode film is preferably used as such a protective film because the inorganic insulating film having an etching selectivity relative to an electrode film is preferably used. Accordingly, it is preferable that the protective film includes the same material as used for the first electrode. In this case, the protective film and the opening of the protective film can be simultaneously just by changing the pattern when the first electrode of the organic EL element is formed by an etching and the like. Therefore, the protective film and the opening of the protective film can be easily formed without additional steps. If the same material is used for the first electrode and the protective film, the protective film can be formed of a conductive material, and therefore, as mentioned in the following preferred embodiment, the protective film can be maintained at a constant potential. In addition, if the same material is used for the first electrode and the protective film, it is preferable that the protective film and the first electrode in the display region are formed into the same pattern in order to simplify the production processes.

In a top-emission type organic EL panel in which light emitted from the organic EL element is output from the side opposite to the substrate, the first electrode includes a conductive substance with light reflectivity. Also in the top-emission type one, the same material may be used for the protective film and the first electrode. In this case, the protective film can be formed without additional steps because the protective film can be formed together with the first electrode. Further, in the top-emission type one, the following preferred embodiment may be mentioned. The first electrode includes a conductive substance with light reflectivity, and the protective film includes a material with no light reflectivity. ITO, IZO, and the like may be used as the material with no light reflectivity. Such a preferred embodiment has an advantage in that the protective film is hardly recognized under external light because the protective film has no light reflectivity.

It is preferable that the protective film includes a plurality of conductive portions electrically connected to each other. That is, it is preferable that the above-mentioned protective film includes a plurality of conductive portions and the plurality of conductive members are electrically connected to each other. According to this, if the protective film includes the plurality of conductive members, a variation in potential among the conductive portions can be prevented. As a result, a reduction in control stability of the organic EL panel, which is caused because the drivers and the wirings formed in the non-display region are influenced by the variation in potential among the conductive portions, can be prevented.

Further, it is preferable that the protective film is maintained at a constant potential. If the protective film is formed using a conductive material that is the same as for the first electrode, examples of an electrical condition of the protective film include a floating potential condition in which the protective film is insulated with another conductive member, and a state where the protective film is connected to another conductive member to have the same potential as that of the conductive member. If the protective film is in the floating potential condition, the drivers and the wirings formed in the non-display region are influenced depending on the existence of the protective film or variation in potential among the protective films formed in different regions, and as a result, the control stability of the organic EL panel might be reduced. However, if the protective film is connected to another conductive member which maintains a constant potential, the protective film can stably maintain a constant potential relative to the drivers and the wirings formed in the non-display region. As a result, the instability due to the arrangement of the protective film, as seen when the protective film is in the floating potential condition, can be prevented. Therefore, the organic EL panel can stably display images.

The value of the above-mentioned constant potential (DC potential) is not especially limited, but it is preferably within a range of about −20V to about +20V, and more preferably within a range of about −10V to about +10V in order to supply a potential from a common power-supply IC. The supply potential is still more preferably 0V (ground potential) because such a state is the most stable state. It is also preferable that the above-mentioned constant potential is the same as either one of supply potentials used in another application, in order to reduce the number of the power supply used in a display module.

A measure for maintaining the above-mentioned protective film at a constant potential is not especially limited, but a method of electrically connecting the protective film to the second electrode is preferable. That is, it is preferable that the protective film is electrically connected to the second electrode. If the protective film is electrically connected to the second electrode of the organic EL element in order to maintain the protective film at a constant potential, there is no need to form complicated patterns and increase the number of the power supplies, and further the second electrode which is extended up to a portion where the second electrode is extracted from the display region to the non-display region can be easily arranged. The second electrode and the protective film electrically connected to the second electrode preferably have a potential (DC potential) within a range of about −20V to about +20V, and more preferably within a range of about −10V to about +10V. The potential is still more preferably 0V (ground potential) in order to stably control the second electrode into which current flows from the organic EL element in each pixel.

It is preferable in the organic EL panel according to a preferred embodiment of the present invention that the substrate on which an organic electroluminescent element is formed is attached to a sealing member with an adhesive material circularly arranged on an outer circumference of the organic EL panel, and the organic insulating film is not formed below the adhesive material. The above-mentioned sealing member is not especially limited as long as it is a member having a structure capable of forming a sealing space including the organic EL element by being attached to the substrate on which including the organic EL element. A sealing substrate formed by carving a glass substrate except for the outline thereof, a metal sealing can, and the like may be mentioned. The sealing member may be integrated with the substrate including the organic EL element, with the adhesive material therebetween. In addition to the adhesive material, the inorganic insulating film and the like may be positioned at the portion where the substrate including the organic EL element is attached to the sealing member. Further, it is preferable that the organic insulating film is not formed between the adhesive material and the substrate, and arranged inside a region surrounded by the adhesive material. The reason is given below. If the organic insulating film is formed up to the outside of the sealed region, external moisture permeates the organic insulating film and enters the sealed space because the organic insulating film has a high permeability. As a result, the sealing effect is reduced.

It is preferable in the organic EL panel according to a preferred embodiment of the present invention that the inorganic insulating film is formed below the adhesive material. It is more preferable that the inorganic insulating film is formed between the adhesive material and a wiring-extracting portion. According to this, moisture is effectively prevented from entering the sealed space and further, even if the organic insulating film is not formed below the adhesive material, the wiring which is extended from the sealed space to the outside of the attached portion can be protected. That is, the inorganic insulating film can suppress short circuit between the wirings, caused by foreign substances which might enter when the attachment of the substrate is performed, or disconnection caused by cracks and the like.

Attributed to the above-mentioned sealing structure, the organic EL element can be protected from influences of moisture, oxygen atmosphere, and the like, and further, the residual moisture contained in the organic insulating film can be released out of the opening formed in the inorganic insulating film, into the sealed space. Therefore, an organic EL panel with high reliability, which includes an organic EL element hardly influenced by moisture, can be obtained.

It is preferable that a drying agent is arranged to face an airtight space formed between the substrate on which the organic electroluminescent element is formed and the sealing member. According to such a structure, the moisture concentration inside the airtight space can be lowered and the moisture remaining in the organic insulating film can be absorbed.

Therefore, the deterioration with time of the organic EL element, due to the moisture, can be further effectively prevented.

Another preferred embodiment of the present invention provides an organic electroluminescent display device including the organic electroluminescent panel described above. This preferred embodiment of the present invention can provide an organic EL display device which is excellent also in reliability of luminance of emitted light, without deteriorating advantageous characteristics of a common organic EL display device.

The organic EL panel according to a preferred embodiment of the present invention has the above-mentioned configuration. Therefore, residual moisture in the organic insulating film in the non-display region is also reduced by the dehydration treatment, thereby preventing a reduction in luminance, which starts from the peripheral portion of the display region. As a result, the reliability of the luminance of emitted light in the organic EL panel can be improved.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

The present invention is mentioned in more detail below with reference to preferred embodiments, using drawings, but not limited to only these preferred embodiments.

Preferred Embodiment 1

Figure 1:
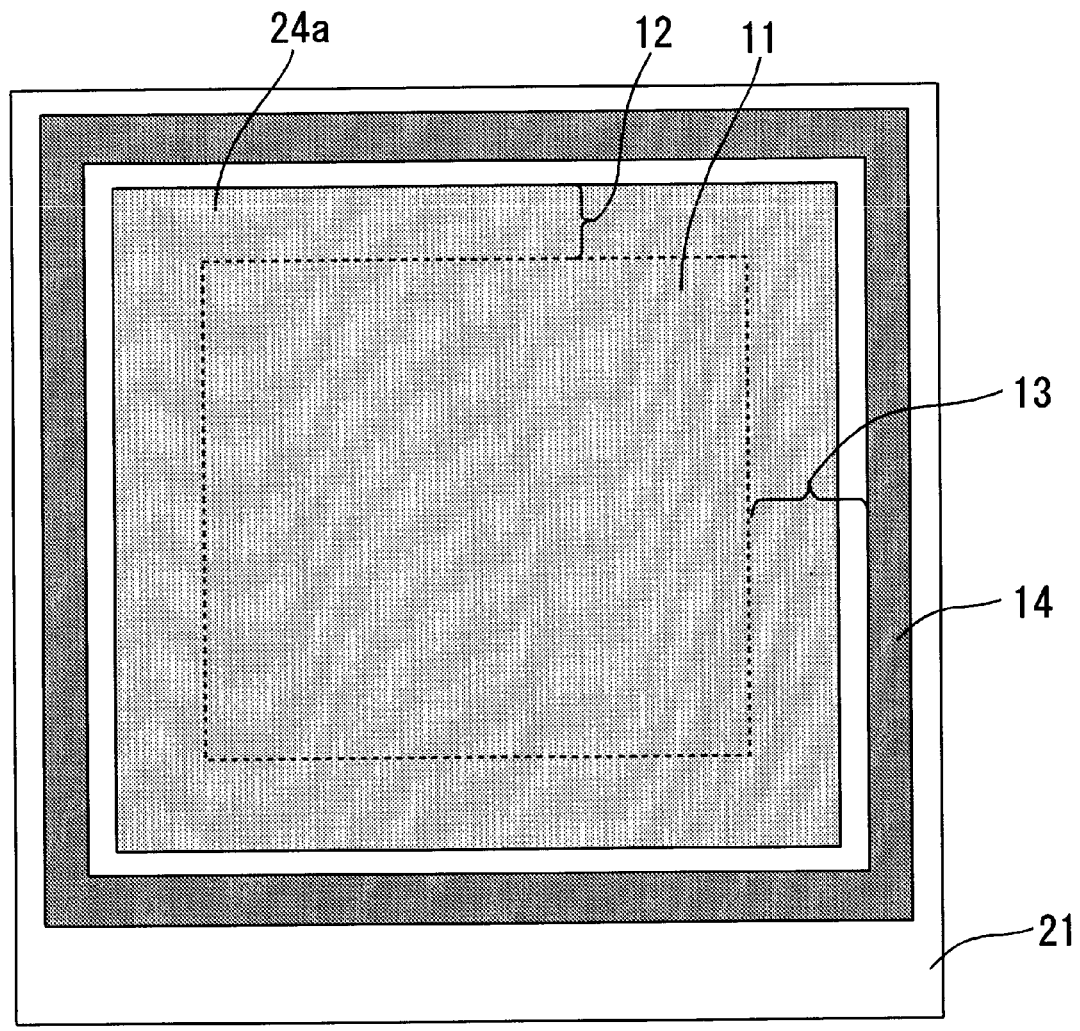
FIG. 1 is a planar view schematically showing an appearance of the active matrix organic EL panel in accordance with Preferred Embodiment 1 of the present invention.

FIG. 1 is a planar view schematically showing an appearance of an active matrix organic EL panel in accordance with Preferred Embodiment 1.

As shown in FIG. 1, an organic EL panel according to the present preferred embodiment includes a display region 11 which actually displays images, a peripheral region 13 which is positioned at the peripheral portion of the display region 11, a sealing region 14. The display region 11 is constituted by a plurality of pixels. Each of the plurality of pixels includes an organic EL element, and a switching TFT and a driving TFT each for controlling driving of the pixel. Further, in each pixel, a drain electrode of the driving TFT is connected to the first electrode of the organic EL element through a contact hole perforated in an organic insulating film. In the peripheral region 13, a driver including the TFT, and various wirings are arranged to control driving of the plurality of pixels arranged inside the display region 11. The sealing region 14 is positioned on the outer circumference of the peripheral region 13. In the sealing region 14, an insulating substrate 21 is attached to a sealing substrate with a resin adhesive material therebetween. Inside the thus-formed sealed space (airtight space), the display region 11 and the peripheral region 13 are included.

Figure 2:
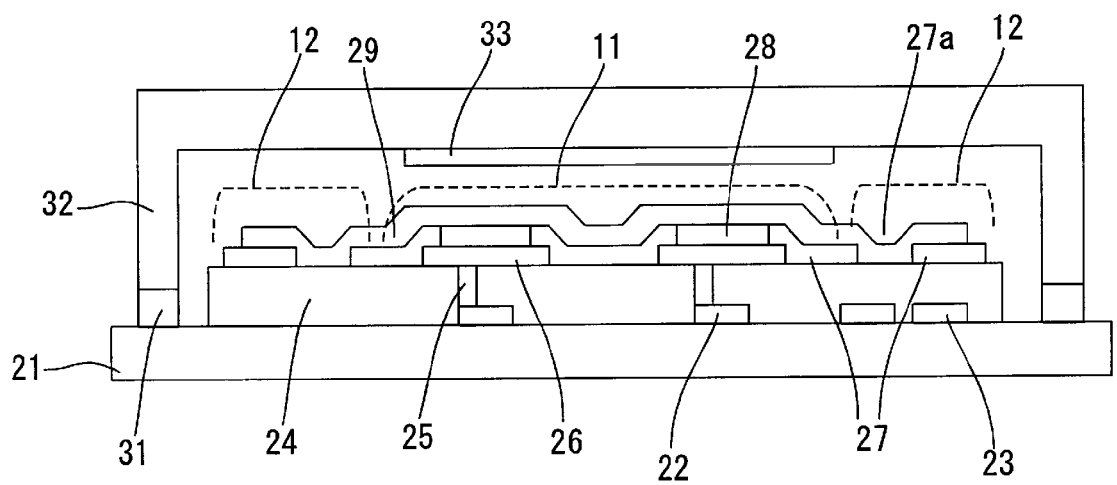
FIG. 2 is a cross-sectional view schematically showing the active matrix organic EL panel in accordance with Preferred Embodiment 1 of the present invention.

FIG. 2 is a cross-sectional view schematically showing the active matrix organic EL panel in accordance with Preferred Embodiment 1.

Hereinafter, the configuration of the active matrix organic EL panel according to the present preferred embodiment is mentioned with reference to one production method.

In production steps of the active matrix organic EL panel in the present preferred embodiment, a switching TFT (not shown), a driving TFT 22, a driver 23, and various wirings (not shown) are formed on an insulating substrate such as a glass substrate, and thereon, an interlayer insulating film (organic insulating film) 24 composed of an organic material is formed. The interlayer insulating film 24 is formed by coating an acrylic resin (organic material) to have a thickness of about 2 μm, for example, with a spin coater. A polyimide resin film, a dry film resist and the like may be used as the organic insulating film constituting the interlayer insulating film 24.

In the display region 11, the interlayer insulating film 24 is formed to flatten an uneven surface formed by the switching TFT, the driving TFT 22, and the wirings. Therefore, the organic EL element can be protected from influences of the unevenness. Further, in the display region 11, a contact hole 25 which is used for connecting a drain electrode of the driving TFT 22 to a transparent electrode 26 that is the first electrode of the organic EL element in the pixel is formed to penetrate the interlayer insulating film 24.

In the peripheral region 13, the interlayer insulating film 24 is formed, thereby protecting the driver 23 and the various wirings from damage in the following steps, that is, an etching solution used when the transparent electrode is formed by patterning as mentioned below. Further, due to the interlayer insulating film 24, a parasitic capacitance can be reduced when an electromagnetic shielding structure is formed. The electromagnetic shielding structure is a structure in which the driver 23 is covered with a conductive material, and thereby the driver 23 is prevented from malfunctioning by influences of external various electromagnetic waves and static electricity. The electromagnetic shielding structure can be easily formed by forming a structure in which the driver 23 is covered with the second electrode (cathode) 29 of the organic EL element. However, in this case, the cathode 29 must be insulated with the driver 23. Further, in order to suppress a parasitic capacitance generated between the cathode 29 and the driver 23 or the various wirings from increasing loads, it is preferable that this parasitic capacitance is decreased. For decreasing the parasitic capacitance, the cathode 29 is insulated with the driver 23 by an interlayer insulating film having a low dielectric constant and a large thickness of about 2 μm, for example.

If the interlayer insulating film 24 is formed to the outside of the sealing region 14, external moisture permeates the interlayer insulating film 24 and enters the sealed space because the interlayer insulating film 24 composed of an organic material has a high permeability. As a result, the sealing effect is reduced. Therefore, the interlayer insulating film 24 in the sealing region 14 must be removed. Accordingly, the interlayer insulating film 24 which is formed over the entire surface of the insulating substrate 21 by coating is removed, except for needed portions, by photo development using a positive photoresist. The removed portions of the interlayer insulating film 24 include: a portion where the cathode 29 is connected to a cathode-extracting wiring (not shown) formed on the insulating substrate 21; and a region which is electrically connected to an external circuit, in addition to the above-mentioned regions where the sealing region 14 and the contact hole 25 are formed.

Then, as an anode of the organic EL element, the first electrode 26 is formed on the interlayer insulating film 24. If the organic EL panel has a bottom-emission structure in which light emitted from the organic EL element is output from the substrate side, the first electrode needs to have translucency. A transparent conductive film made of indium tin oxide (ITO), indium zinc oxide (IZO), aluminum zinc oxide (AZO), gallium zinc oxide (GZO), and the like, may be used as the first electrode. If the organic EL panel has a top-emission structure in which light emitted from the organic EL element is output from the side opposite to the substrate, the first electrode needs to have reflectivity. A single layer composed of a metal with reflectivity, such as aluminum, silver, and nickel, or a multilayer structure of the above-mentioned metal with reflectivity and a transparent conductive film may be used. According to the present Embodiment, the bottom-emission structure is used, and the first electrode 26 is formed into a specific pattern by forming a transparent conductive film made of indium tin oxide (ITO) on the interlayer insulating film 24 by a sputtering method to have a thickness of about 150 nm and then etching the formed film by a photoresist method using hydrobromic acid. When the first electrode 26 is etched using a photoresist method, water is used for washing and removing the etched photoresist. Therefore, the organic insulating film constituting the interlayer insulating film 24 might absorb moisture. As a washing method, a method including immersion into a stripping liquid and ultrasonic washing in purified water, and the like, may be mentioned.

On the substrate in which the first electrode 26 is formed, a silicon oxide ($SiO_2$) film is formed by a sputtering method as an inorganic insulating film 27 to have a thickness of about 150 nm, for example. The inorganic insulating film 27 covers the edge portion of the first electrode 26 to prevent current leakage at the edge of the first electrode 26 of the organic EL element. As mentioned below, an organic EL layer 28 is formed in a region not covered with the inorganic insulating film 27 of the organic EL element and this region serves as a light-emitting part, in accordance with the present preferred embodiment. According to the present preferred embodiment, the interlayer insulating film 24 in the sealing region 14 is removed in order to improve the sealing effect. Therefore, if conductive patterns (circuit and wiring) are formed in the sealing region 14 on the insulating substrate 21, it is preferable that the inorganic insulating film 27 is formed also in the sealing region 14 in order to prevent short circuiting between the conductive patterns, caused by conductive foreign substances and the like when the sealing is performed.

The inorganic insulating film 27 formed over the entire surface of the insulating substrate 21 is dry-etched by a photoresist method using ($CF_4+O_2$) gas to be provided with openings at specific positions. In a preferred embodiment of the present invention, the openings of the inorganic insulating film 27 are formed in the region (non-display region) 12 where the interlayer insulating film 24 is formed in the peripheral region 13, in addition to the portion above the first electrode 26 of the organic EL element excepting the edge thereof (the first opening), the portion where the cathode 29 is connected to a cathode-extracting wiring, and the portion which is electrically connected to an external circuit. Because of the existence of these openings (the second openings) 27a of the inorganic insulating film 27, formed in the non-display region 12, moisture remaining in the interlayer insulating film 24 in the non-display region 12 can be sufficiently removed. Also when the inorganic insulating film 27 is etched into a pattern using a photoresist method, water is used to wash and remove the etched photoresist, the organic insulating film constituting the interlayer insulating film 24 might absorb moisture.

Figure 3:
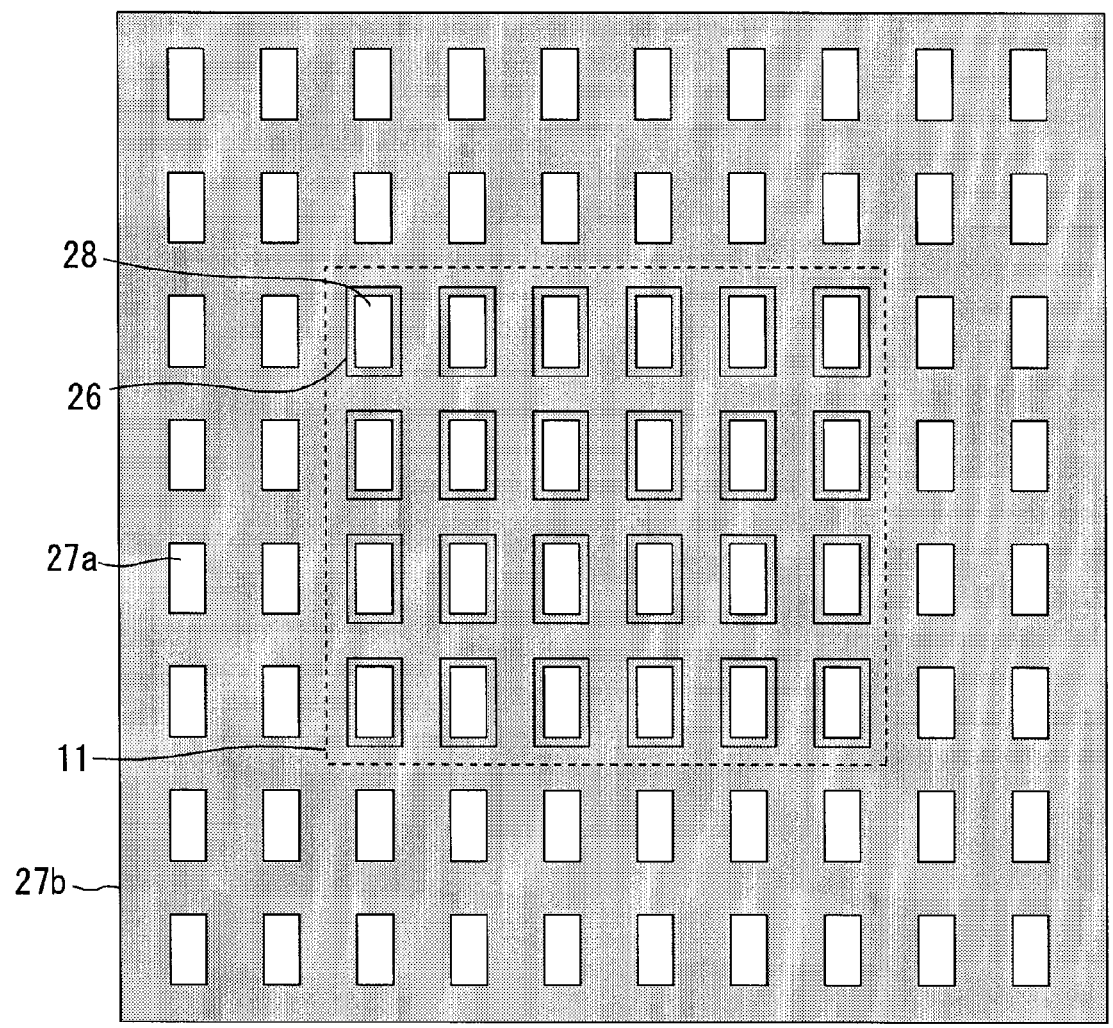
FIG. 3 is a planar view schematically showing a configuration of a display region and a non-display region of the active matrix organic EL panel in accordance with Preferred Embodiment 1 of the present invention.

The pattern of the second opening 27a formed in the non-display region 12 is not especially limited. As shown in FIG. 3 as one example, it is preferable that the second openings 27a in the non-display region 12 and the first openings in the display region 11 are formed into the same pattern. Therefore, the first openings in the display region 11 and the second openings 27a in the non-display region 12 are easily formed in the same pattern. The larger the second opening 27a in the non-display region 12 is, the larger the obtained dehydration effect is.

Then, a dehydration treatment is performed to remove moisture remaining in the interlayer insulating film 24. In the dehydration treatment, the substrate after the inorganic insulating film 27 is formed is maintained for 48 hours in a vacuum oven at 170° C. and 13.3 Pa (0.1 Torr), for example. Conditions of the dehydration treatment are not limited to those mentioned above. The operation and effects of the present preferred embodiment can be obtained if the dehydration is performed, for example, under heating and drying.

Then, the surface of the first electrode 26 composed of ITO is washed as a pretreatment before formation of the organic EL layer 28. The washing method is not especially limited, and a UV ozone treatment is preferable, for example.

According to the UV washing method, the substrate is irradiated with UV in air, and by the generated ozone, the first electrode 26 surface is washed.

Then, the organic EL layer 28 is formed in the opening (the first opening) of the inorganic insulating film 27 formed on the first electrode 26 in the display region 11. As the organic EL layer 28, a diamine derivative (TPD) film as a hole transport layer and a tris(8-quinolinato) aluminum (Alq3) film as a light-emitting layer are successively formed and stacked by a vacuum deposition method.

Then, the second electrode 29 is formed as a cathode of the organic EL element. According to the bottom-emission structure in which light emitted from the organic EL element is output from the substrate side, an alloy of a material with an electron-injecting property and a low-resistance material with reflectivity, a multilayer film of these materials, and the like may be used as the second electrode 29. If the organic EL panel has a top-emission structure in which light emitted from the organic EL element is output from the side opposite to the substrate, an alloy of a material with an electron-injecting property and a low-resistance material with translucency, a multilayer film of these materials, and the like may be used. In the present preferred embodiment, the bottom-emission structure is used, and a Mg—Ag film having a thickness of about 200 nm, for example, is formed by a vacuum deposition method as the second electrode 29 using a mask. The second electrode 29 is a common cathode in all of the pixels, and therefore formed in the entire display region 11. Further, the second electrode 29 is formed above the driver 23 in the non-display region 12 in order to form the electromagnetic shielding structure. The cathode 29 is connected to a cathode-extracting wiring (not shown) through a contact portion which penetrates the interlayer insulating film 24 and the inorganic insulating film 27, and further connected to an external circuit through the cathode-extracting wiring.

Finally, a sealing substrate 32 is attached to the sealing region 14 with a seal material 31 composed of an epoxy UV-curing resin therebetween, thereby forming an airtight space including the display region 11 and the peripheral region 13. As a result, the organic EL elements formed in the display region 11 are sealed. The adhesive material 31 is not limited to the above-mentioned epoxy UV-curing resin, and a material having a low permeability is preferable. The sealing method is not especially limited. According to the present preferred embodiment, a drying agent 33 is positioned at a caved portion of the sealing substrate 32 prepared by caving a glass substrate by sandblast. Then, the sealing substrate 32 is attached to the substrate including the organic EL elements in a glove box in such a way that the driving agent 33 faces the organic EL elements. The glove box is filled with inert gas, and the inside of the glove box is maintained at a moisture concentration of about 1 ppm or less and an oxygen concentration of about 1 ppm or less, for example. The thus-prepared sealed space is filled with inert gas such as $N_2$ and maintained at a low moisture concentration. The dehydration effect for the interlayer insulating film 24 is accelerated because the second openings 27a of the inorganic insulating film 27 contact the sealed space. In the above-mentioned manner, the organic EL panel shown in FIGS. 1 to 3 is prepared.

Figure 4:
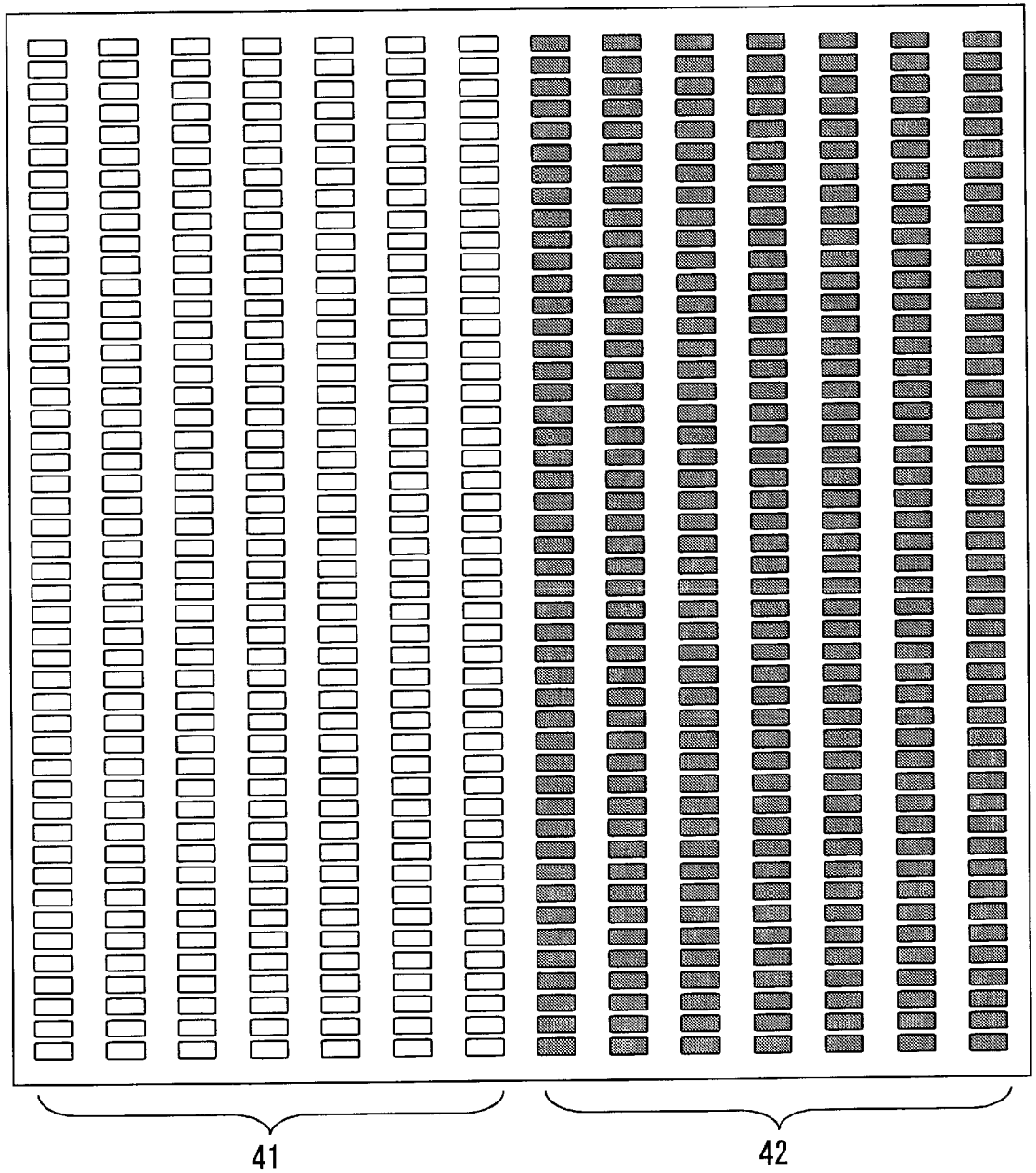
FIG. 4 is a graph showing the number of an extinction pixel array when organic EL panels having various different aperture ratios of the second openings from 0 to 100% are subjected to a high-temperature preservation test at 85° C. for 300 hours.

The organic EL panel in accordance with the present preferred embodiment is evaluated for reliability of luminance of emitted light by varying the aperture ratio of the second openings 27a from 0 to 100%. However, 0% of the aperture ratio of the second openings 27a is not included in the present invention. FIG. 4 shows the evaluation results.

Figure 5:
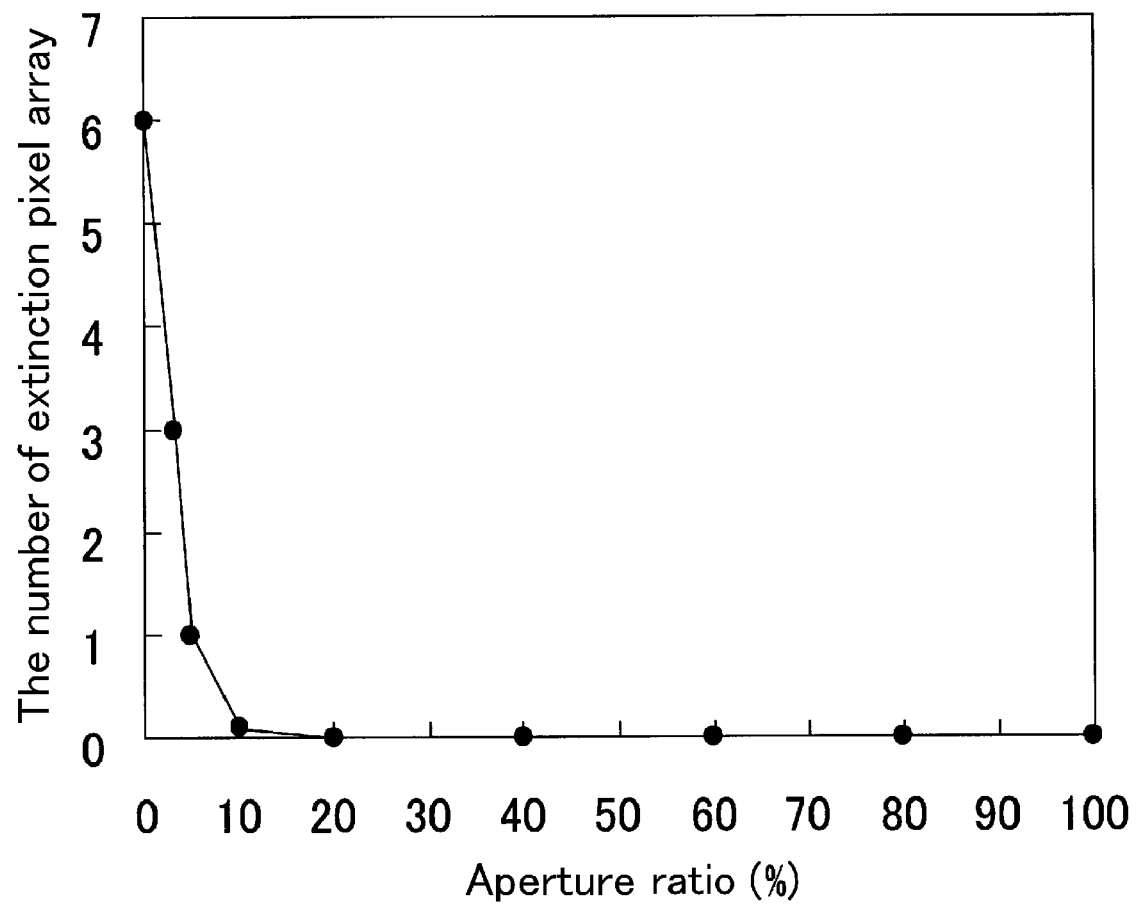
FIG. 5 is an explanation view showing pixel shrinkage.

FIG. 4 shows the number of an extinction pixel array when organic EL panels having various different aperture ratios of the second openings from 0 to 100% are subjected to a high-temperature preservation test at 85° C. for 300 hours. FIG. 5 shows pixel shrinkage. As shown in FIG. 4, when an area of the second openings 27a accounts for about 10% or more relative to the area of the non-display region, a reduction in luminance, which starts from the periphery portion of the display region, is improved and hardly observed.

According to the present preferred embodiment, the bottom-emission structure in which the ITO transparent conductive film is used as the first electrode and the Mg—Ag film is used as the second electrode is mentioned. However, the present invention is not especially limited to such a preferred embodiment, and materials other than the above-mentioned materials may be used. The present invention can be preferably used even in the top-emission structure.

Preferred Embodiment 2

The present preferred embodiment provides a light-emitting layer composed of a high molecular organic EL material formed by an ink-jet method, although, in Preferred Embodiment 1, the light-emitting layer composed of a low molecular organic EL material is formed by a vacuum deposition method.

Figure 6:
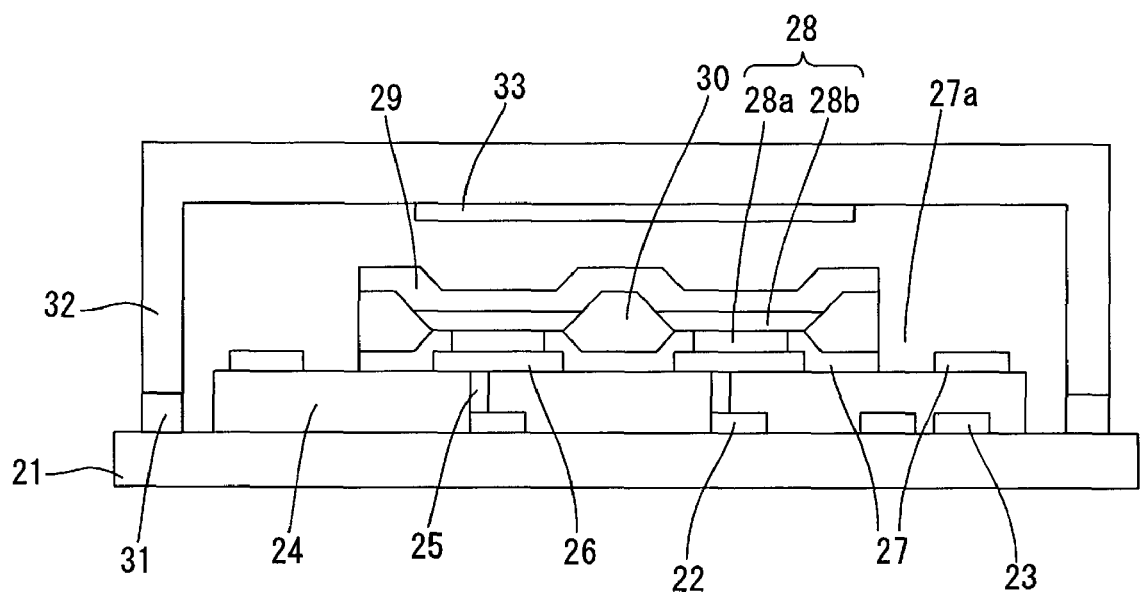
FIG. 6 is a cross-sectional view schematically showing the active matrix organic EL panel in accordance with Preferred Embodiment 2 of the present invention.

FIG. 6 is a cross-sectional view schematically showing an active matrix organic EL panel in accordance with Preferred Embodiment 2. As shown in FIG. 6, a bank 30 is arranged around the periphery of a light-emitting layer 28b, and by injecting a liquid material for the light-emitting layer 28b into the inside of the bank 30 using an ink-jet device, the light-emitting layers 28b can be arranged in a desired pattern.

Hereinafter, the configuration of the active matrix organic EL panel in the present preferred embodiment is mentioned with reference to one production method.

The active matrix organic EL panel in accordance with the present preferred embodiment is produced in the same manner as in the active matrix organic EL panel in Preferred Embodiment 1 except for the steps after the step in which the openings of the inorganic insulating film 27 are formed by patterning and the interlayer insulating film 24 is subjected to the dehydration treatment. Then, on the substrate after the openings of the inorganic insulating film 27 are formed by patterning, a photosensitive organic film composed of polyimide, for example, is coated and formed to have a thickness of about 2 μm by a spin coat method, and the like. Further, by a photo development method, the photosensitive organic film is patterned to surround the first electrode 26 composed of ITO, thereby forming the bank 30. Also when the bank 30 is formed by patterning using a photo development method, water is used for washing after development. Therefore, the organic insulating film constituting the interlayer insulating film 24 might absorb moisture.

If polyimide and the like is used as a photosensitive organic film for bank, adhesiveness between the photosensitive organic film and the interlayer insulating film 24 is insufficient, and therefore the films are separated during the steps, which might cause generation of foreign substances.

Therefore, in order to improve the adhesiveness, it is preferable that the inorganic insulating film 27 is formed on the interlayer insulating film 24 unless sufficient dehydration of the interlayer insulating film 24 is inhibited. Therefore, also in the non-display region 12, it is preferable that the inorganic insulating film 27 on the interlayer insulating film 24 is not completely removed, but it is partially remained.

Then, as a pretreatment before a high molecular ink for organic EL is added dropwise into the inside of the bank 30 by an ink-jet method, a hydrophilic treatment using a UV ozone treatment and a hydophobic treatment using a $CF_4$ plasma treatment are successively performed for the substrate including the banks 30. By these treatments, the hydrophilicity of the inorganic insulating film 27 and the first electrode 26 composed of ITO is improved, and further, the hydrophobicity of the bank 30 is increased. Therefore, the ink is maintained inside the bank with efficiency. Successively, the high-molecular ink for organic EL is added dropwise into the inside of the bank 30 by an ink-jet method and then dried and sintered. As a result, the organic EL layer 28 is formed on the first electrode 26. As the organic EL layer 28, a positive hole transport layer 28a and a light-emitting layer 28b are successively formed.

Then, a Ba film and an Al film are successively stacked and formed as the second electrode 29 that is a cathode by a vacuum deposition method. Finally, the sealing substrate 32 is attached to the sealing region 14 with the adhesive material 31 made of an epoxy UV-curing resin therebetween, thereby forming an airtight space including the display region 11 and the peripheral region 13. As a result, the organic EL elements formed in the display region 11 are sealed. The sealing method is not especially limited. According to the present preferred embodiment, a drying agent 33 is positioned at a caved portion of the sealing substrate 32 prepared by caving a glass substrate by sandblasting, and the sealing substrate 32 is attached to the substrate including the organic EL elements in a glove box in such a way that the driving agent 33 faces the organic EL elements. The glove box is filled with inert gas, and the inside of the glove box is maintained at a moisture concentration of about 1 ppm or less and an oxygen concentration of about 1 ppm or less, for example. The thus-prepared sealed space is filled with inert gas such as $N_2$ and maintained at a low moisture concentration. The dehydration effect for the interlayer insulating film 24 is accelerated because the second openings 27a of the inorganic insulating film 27 contact the sealed space. In the above-mentioned manner, the organic EL panel shown in FIG. 6 is prepared.

Preferred Embodiment 3

A preferred embodiment in which a protective film is formed below the second opening of the inorganic insulating film is mentioned below. According to the structure in which the protective film is formed below the second opening of the inorganic insulating film, the organic insulating film can be protected when openings of the inorganic insulating film are formed by an etching and the like. If the protective film is not formed, the organic insulating film might be damaged when the openings of the inorganic insulating film are formed, and the damaged organic insulating film partly becomes dust and causes a reduction in yield. Further, if the protective film is not formed, the organic insulating film is damaged when the openings of the inorganic insulating film are formed, and in the following processes, the wirings or TFTs below the organic insulating film also might be damaged. Accordingly, in this preferred embodiment of the present invention, the structure in which the protective film is formed below the second opening of the inorganic insulating film is preferable.

Figure 7:
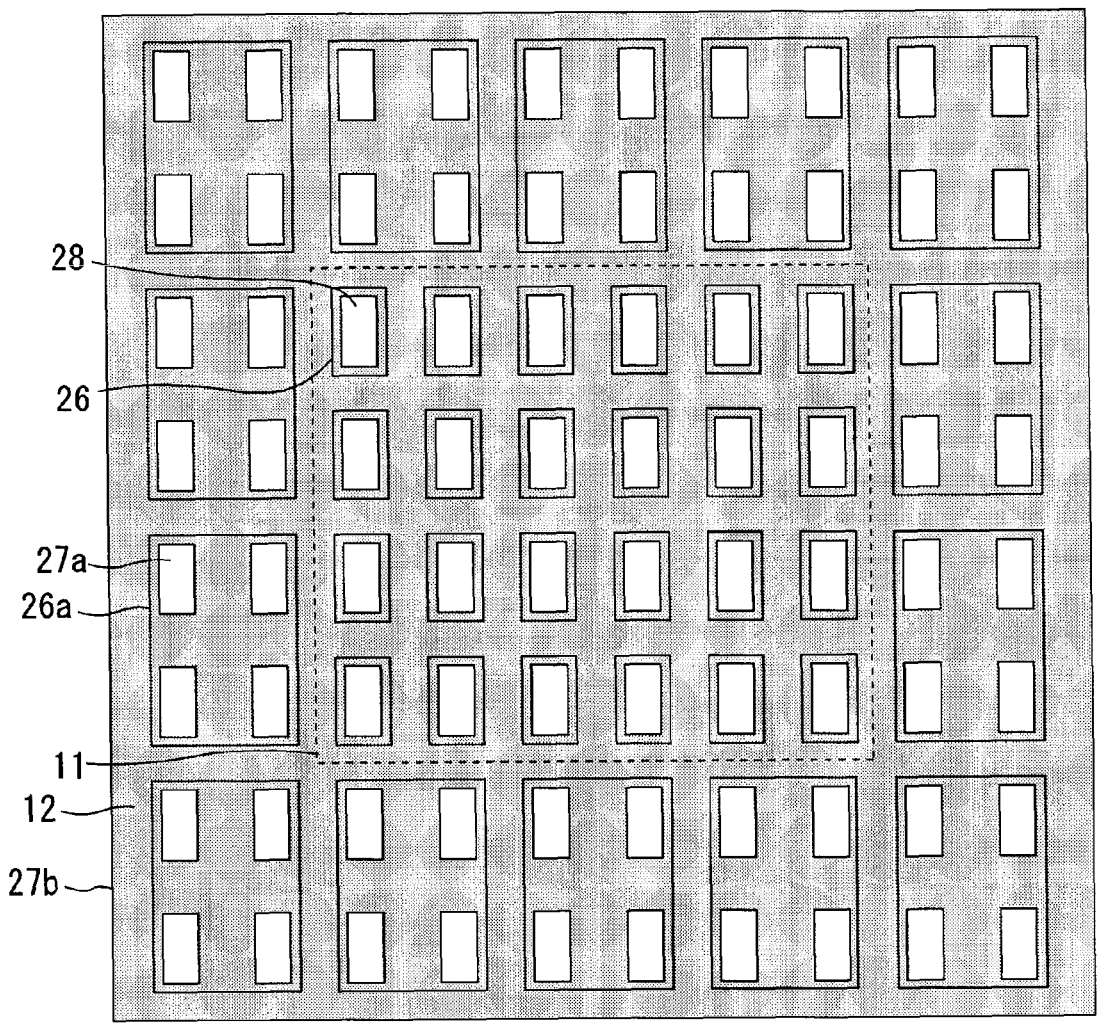
FIG. 7 is a planar view schematically showing a configuration of a display region and a non-display region of the active matrix organic EL panel in accordance with Preferred Embodiment 3 of the present invention.
Figure 8:
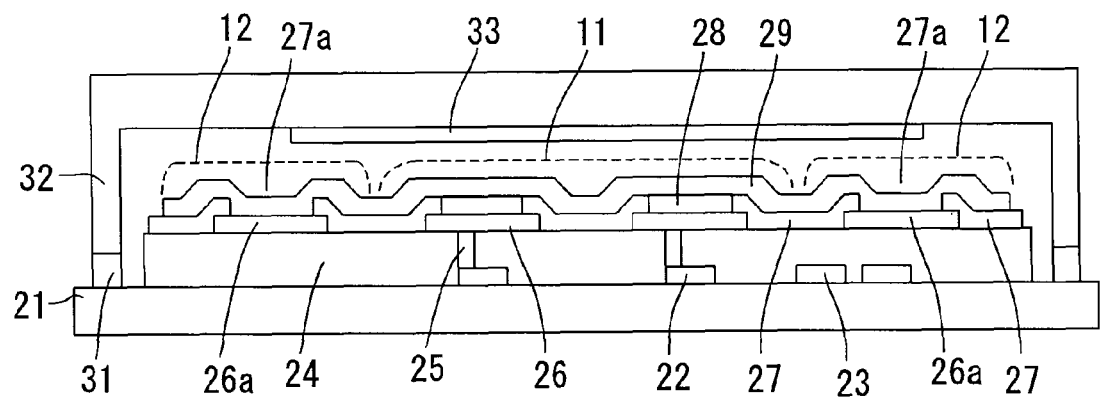
FIG. 8 is a cross-sectional view schematically showing an active matrix organic EL panel in accordance with Preferred Embodiment 3 of the present invention.

The present preferred embodiment, an ITO transparent conductive film constituting the first electrode is preferably used as the protective film. FIG. 7 is a planar view schematically showing a configuration of a display region and a non-display region of an active matrix organic EL panel in accordance with the present preferred embodiment. FIG. 8 is a cross-sectional view schematically showing the active matrix organic EL panel in accordance with the present preferred embodiment. In the present preferred embodiment, components which exhibit the same functions as in Preferred Embodiment 1 are shown by the same symbols.

In the present preferred embodiment, an organic EL panel is prepared in the same manner as in Preferred Embodiment 1, except for the step of forming the first electrode. That is, according to the present preferred embodiment, the step of forming the first electrode also serves as a step of forming the protective film. The ITO transparent conductive film is patterned also in the non-display region 12 when the ITO film in the display region 11 is patterned to form the first electrode 26. As a result, the ITO transparent conductive film is arranged below the second opening 27a of the inorganic insulating film 27, as a protective film 26a for the interlayer insulating film 24. As shown in FIG. 7, one protective film 26a is formed below every four of the second openings 27a of the inorganic insulating 27. The present invention is not limited thereto. One protective film 26a may be formed below each one of the second openings 27a. The number of the second openings 27a which are positioned above one protective film 26a is not especially limited, and three, nine, and the like may be mentioned. If the protective layer 26a is formed, damage to the interlayer insulating film 24 can be reduced when the inorganic insulating film 27 is dry-etched. As a result, production yield of the organic EL panel can be improved.

In the case where the UV ozone treatment is used for washing the first electrode 26 before the organic EL layer 28 is formed, a decrease in thickness of the interlayer insulating film 24 that is an organic substance in the non-display region 12, caused by the UV ozone washing, can be prevented if the protective film 26a is arranged below the second opening 27a. Further, according to this, the thickness of the interlayer insulating film 24 is not involuntarily decreased. Therefore, an increase in load on the circuit and the like, caused by an increase in parasitic capacitance, can be suppressed. Due to the ITO transparent conductive film formed below the opening of the inorganic insulating film 27, etching of the interlayer insulating film 24 is sufficiently prevented.

In the present preferred embodiment, one protective film 26a composed of a transparent electrode is formed below every two or more of the second openings 27a and the size of each protective film 26a is increased. Therefore, the protective film 26a composed of a transparent electrode can be used as an electromagnetic shielding structure for the driver 23 including the TFT or wirings, arranged in the peripheral portion of the display region 11. In this case, it is preferable that each protective film 26a is maintained at a constant potential rather than being electrically floated. If each protective film 26a is electrically floated, the electrical relationship between the protective film 26a and the driver or the wirings positioned below the protective film 26a becomes unstable, resulting in unstable operation. It is preferable that the second electrode 29 of the organic EL element is electrically connected to each protective film 26a in order to maintain the protective film 26a at a constant potential. There is no need to form complicated patterns or increase the number of the supply voltage in order to maintain the protective film 26a at a constant potential. The second electrode 29 which is extended from the inside of the display region 11 to the second electrode-extracting portion in the non-display region 12 can be easily arranged, and therefore, a more perfect electromagnetic shielding structure can be easily formed.

The present preferred embodiment has a configuration in which the first electrode 26 in the display region 11 and the protective film 26a differ in size. Accordingly, the boundary portion between the display region 11 and the peripheral region 13 can be easily observed by eyes after the process of forming the first electrode 26 by patterning. Therefore, in the following process of forming the organic EL element and the second electrode, it can be easily observed by eyes whether the organic EL element and the second electrode 29 can be surely formed in the display region 11.

If the inorganic insulating film 27 is patterned by a dry etching as in the present preferred embodiment, an inorganic substance is preferably used as the protective film in terms of the effect of protecting the organic insulating film. In a preferred embodiment of the present invention, it is preferable that the protective film is composed of the same material as used for the first electrode in order to simplify the production processes. An ITO film that is a transparent conductive film is used according to the present preferred embodiment in which the bottom-emission structure is used. If the top-emission structure is used, the first electrode 26 is an electrode with reflectivity and the second electrode is an electrode with translucency. Only a film composed of the same material as in the transparent conductive film that is the first electrode 26 may be formed as the protective film 26a if the first electrode 26 in the top-emission structure has a multilayer structure of a metal film with reflectivity and a transparent conductive film. In this case, the protective film 26a in the non-display region 12 can be suppressed from being clearly recognized by external light reflected by the metal with reflectivity.

Preferred Embodiment 4

Another preferred embodiment in which the protective film is formed below the second opening of the inorganic insulating film is mentioned below. According to the structure in which the protective film is formed below the second opening of the inorganic insulating film, the organic insulating film can be protected when the openings of the inorganic insulating film are formed by an etching and the like. According to the present preferred embodiment, an organic EL panel is prepared in the same manner as in Preferred Embodiment 3 except that the shape of the protective film 26a in the non-display region is different from that in Preferred Embodiment 3. That is, a transparent electrode that is slightly larger than the second opening 27a is arranged below the second opening 27a of the inorganic insulating film 27, as the protective film 26a for the interlayer insulating film 24, by patterning the ITO transparent conductive film also in the non-display region when the ITO film in the display region 11 is patterned to form the first electrode 26.

Figure 9:
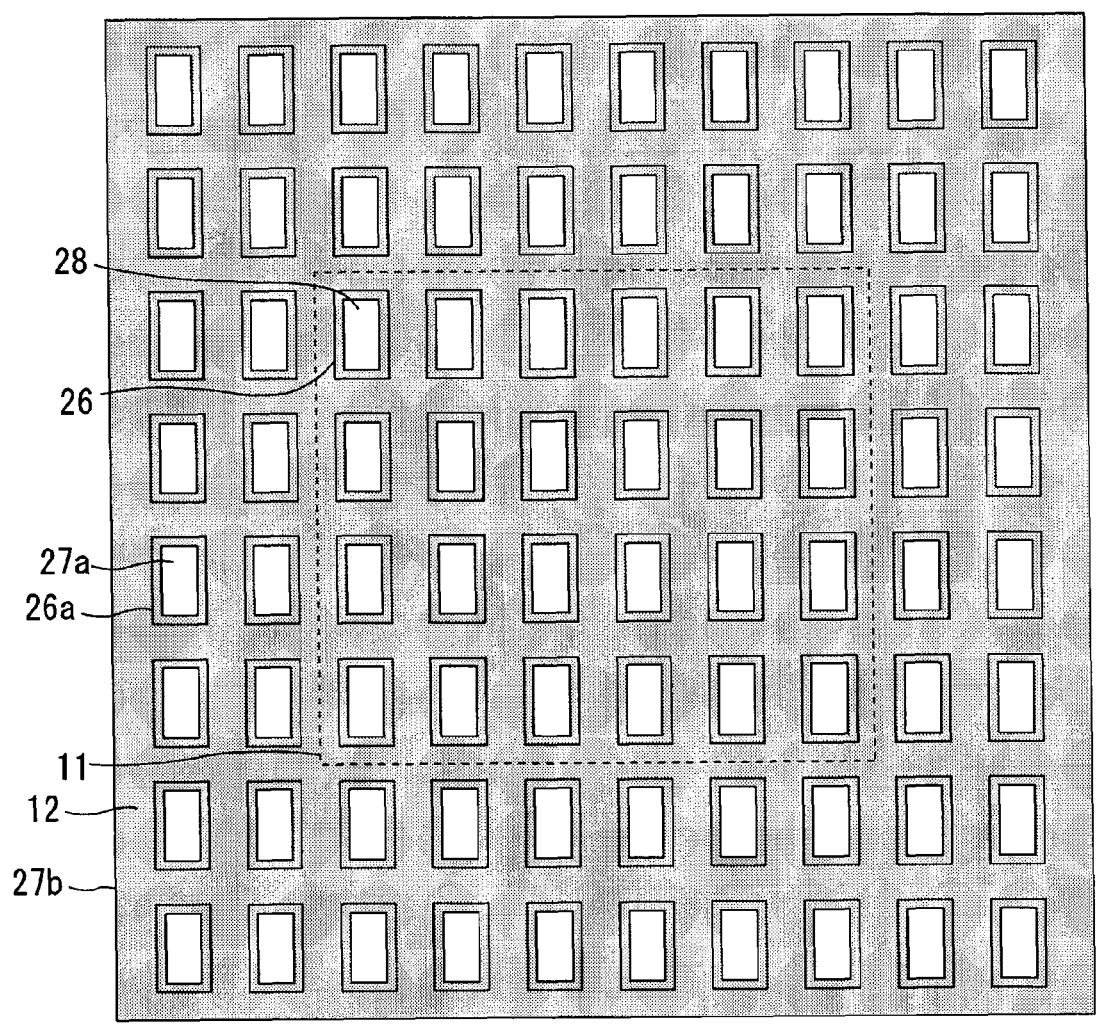
FIG. 9 is a planar view schematically showing a configuration of a display region and a non-display region of the active matrix organic EL panel in accordance with Preferred Embodiment 4 of the present invention.

FIG. 9 is a planar view schematically showing a configuration of a display region and a non-display region of an active matrix organic EL panel in accordance with the present preferred embodiment. The cross-sectional configuration of the active matrix organic EL panel in accordance with the present preferred embodiment is preferably the same as that in Preferred Embodiment 3, shown in FIG. 8.

According to the present preferred embodiment, the step of forming the first electrode serves as a step of forming the protective film. The transparent conductive film is arranged below the second opening 27a of the inorganic insulating film 27, as the protective film 26a for the interlayer insulating film 24, by, also in the non-display region 12, forming the same ITO transparent conductive film pattern as that in the display region 11 when the ITO transparent conductive film in the display region 11 is patterned to form the first electrode 26. As a result, damage to the interlayer insulating film 24 can be reduced when the inorganic insulating film 27 is dry-etched, which leads to an improvement in production yield of the organic EL panel. In the case where a UV ozone treatment is performed for washing the first electrode 26 before the organic EL layer 28 is formed, a reduction in thickness of the interlayer insulating film 24 that is an organic substance in the non-display region 12, caused by the UV ozone treatment, can be prevented by arranging the protective film 26a below the second opening 27a of the inorganic insulating film 27 in the non-display region 12. Further, according to this, the thickness of the interlayer insulating film 24 is not involuntarily decreased. Therefore, an increase in load on the circuit and the like, caused by an increase in parasitic capacitance, can be suppressed.

In a preferred embodiment of the present invention, it is preferable that the protective film is composed of the same material as used for the first electrode in order to simplify the production processes. An ITO film that is a transparent conductive film is used in the present preferred embodiment in which the bottom-emission structure is used. In this case, the ITO film has a low permeability and moisture contained in the interlayer insulating film 24 is released out of the openings of the inorganic insulating film 27 through the ITO film that is a protective film 26a on the interlayer insulating film 24. In the present preferred embodiment, the protective film 26a is preferably formed to have the same pattern as the pattern of the first electrode 26. Therefore, the protective film 26a is formed to be slightly larger than the opening of the inorganic insulating film 27. According to this, moisture can be effectively removed from the portion where the protective film 26a is not formed on the interlayer insulating film 24. In addition, the protective films 26a are arranged on the substrate surface in a lattice pattern. Therefore, the wiring below the interlayer insulating film 24 and the protective film 26a above the interlayer insulating film 24 can be easily formed so as to overlap with each other as viewed in plane. Therefore, damages on the wiring can be effectively prevented.

In the present preferred embodiment, the second opening 27a of the inorganic insulating film and the first opening of the inorganic insulating film 27 in the pixel portion of the display region 11 have the same size. The protective film 26a and the first electrode 26 have the same size. Accordingly, the interlayer insulating film 24 in the display region 11 and that the non-display region 12 can be dehydrated almost uniformly in the surface plane.

In the present preferred embodiment, the protective films 26a and the first electrodes 26 are simultaneously formed by patterning. As mentioned above, the first electrode 26 and the protective film 26a are formed to have the same size. Therefore, also at the boundary between the display region 11 and the non-display region 12, the ITO film patterns in the same size are arrayed. That is, in the display region 11, the pattern density of the ITO film is the same between the center and the periphery. Therefore, the ITO film can be more uniformly patterned.

Each protective film 26a is preferably maintained at a constant potential, rather than being electrically floated. In order to maintain the protective film 26a at a constant potential, it is preferable that each protective film 26a is electrically connected to the second electrode 29 of the organic EL element.

In the top-emission structure, the first electrode 26 is an electrode with reflectivity and the second electrode is an electrode with translucency. Also in this case, a film composed of the same material as in the first electrode 26 can be formed as the protective film 26a in the non-display region 12. Only a film composed of the same material as used for the transparent conductive film that is the first electrode 26 may be formed as the protective film 26a if the first electrode 26 in the top-emission structure, has a multilayer structure of a metal film with reflectivity and a transparent conductive film.

Preferred Embodiment 5

Another preferred embodiment in which the protective film is formed below the second opening of the inorganic insulating film is described below. According to the structure in which the protective film is formed below the second opening of the inorganic insulating film, the organic insulating film can be protected when the openings of the inorganic insulating film are formed by an etching and the like. In the present preferred embodiment, the organic EL panel is prepared in the same manner as in Preferred Embodiment 4, except that the shape of the protective film 26a in the non-display region 12 is different from that in Preferred Embodiment 4 and the protective film 26a includes openings 100.

Figure 10:
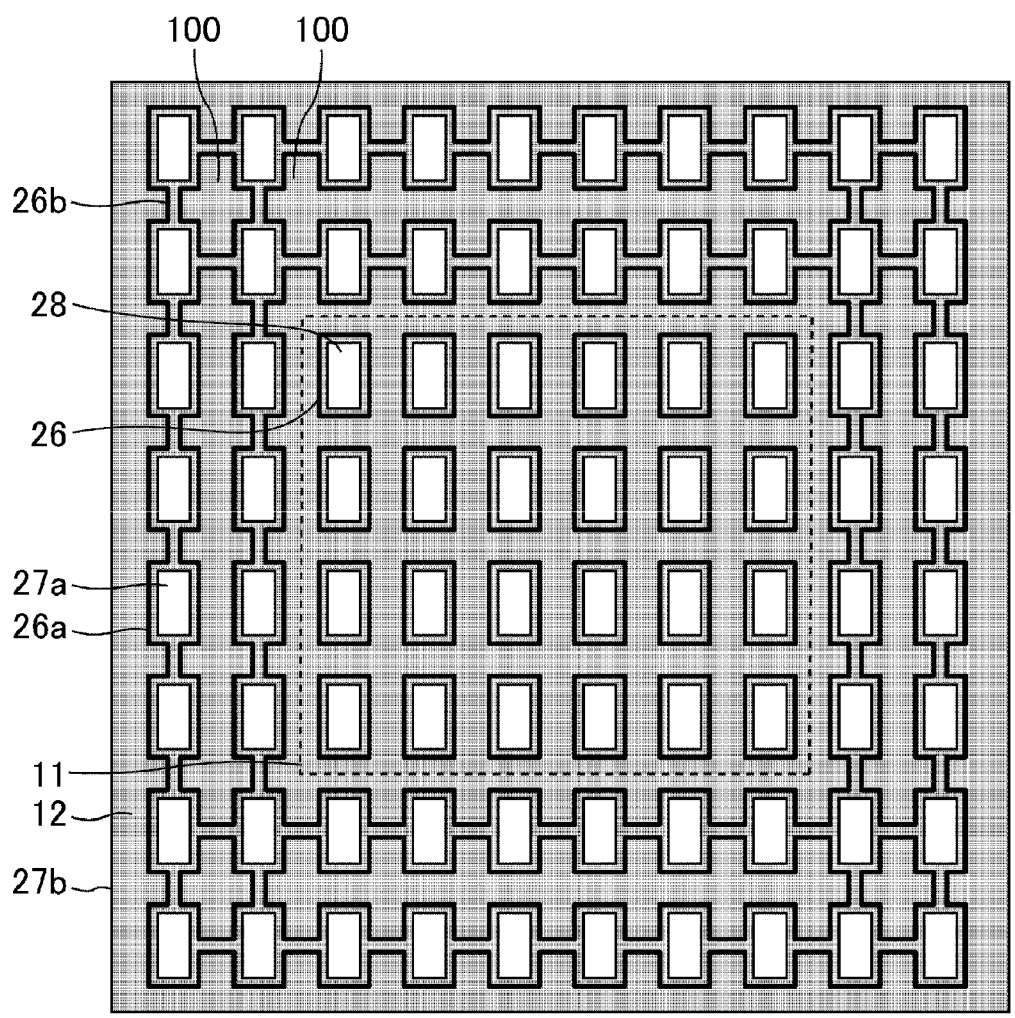
FIG. 10 is a planar view schematically showing a configuration of a display region and a non-display region of the active matrix organic EL panel in accordance with Preferred Embodiment 5 of the present invention.

FIG. 10 is a planar view schematically showing a configuration of a display region and a non-display region of an active matrix organic EL panel in accordance with the present preferred embodiment. The cross-sectional configuration of the active matrix organic EL panel in accordance with the present preferred embodiment is the same as the organic EL panel in Preferred Embodiment 3, shown in FIG. 8.

According to the present preferred embodiment, a transparent conductive film is arranged below the second opening 27a of the inorganic insulating film 27, as the protective film 26a for the interlayer insulating film 24 by, also in the non-display region 12, forming the same ITO transparent conductive film pattern as in the display region 11 when the ITO transparent conductive film is patterned to form the first electrode 26 in the display region 11. According to the present preferred embodiment, as shown in FIG. 10, the protective films 26a in the non-display region 12 include openings 100 and are electrically connected to each other via a conductive connection portion 26b. As a result, all of the protective films 26a are maintained at a constant potential. The connection portion 26b may be composed of a material that is different from the material for the first electrode 26 and the protective film 26a, but, according to the present preferred embodiment, the connection portion 26b is simultaneously formed with the first electrode 26 and the protective film 26a using the same material. As a result, the connection portion 26b can be formed by patterning without an increase in steps.

The protective film 26a is preferably maintained at a constant potential, rather than being electrically floated. In order to maintain the protective film 26a at a constant potential, it is preferable that the protective film 26a is electrically connected to the second electrode of the organic EL element. As a result, there is no need to form complicated patterns and increase the number of the supply voltage. Additionally, the second electrode 29 which is extended from the inside of the display region 11 to the second electrode-extracting portion in the non-display region 12 can be easily arranged, and therefore, an electromagnetic shielding structure can be easily formed. According to the present preferred embodiment, the protective films 26a are connected to each other via the connection portion 26b, and therefore, all of the protective films 26a can be surely electrically connected to the second electrode 29. If the connection portion 26b is not formed, all of the protective films 26a need to be covered with the second electrode 29 in order to electrically connect all of the protective films 26a to the second electrode 29. If the outer circumferential portion of the second electrode 29 is sufficiently large relative to the non-display region 12, all of the protective films 26a can be surely connected to the second electrode 29. However, practically, the outer circumferential portion of the second electrode 29 and the outer circumferential portion of the non-display region 12 have almost the same size because the panel frame needs to be reduced or the second electrode 29 tends to be deteriorated when overlapping with the sealing region 14. Accordingly, if the connection portion 26b is not formed, the second electrode 29 needs to be formed with higher accuracy in order to cover all of the protective films 26 with the second electrode 29. However, if the protective films 26a are connected to each other via the connection portion 26b as in the present preferred embodiment, all of the protective films 26a are not necessarily covered with the second electrode 29. The protective films 26a are electrically connected to each other via the connection portion 26b, and therefore, all of the protective films 26a are electrically connected to the second electrode 29 as long as some of the protective films 26a are covered with the second electrode 29. Accordingly, the use of the present preferred embodiment achieves the following advantages: not so high accuracy is needed for forming the second electrode 29; and a degree of freedom in design of the shape of the second electrode 29 becomes larger.

As a result of providing the protective film 26a, damage to the interlayer insulating film 24 can be reduced when the inorganic insulating film 27 is dry-etched, which leads to an improvement in production yield of the organic EL panel. In the case where a UV ozone treatment is performed for washing the first electrode 26 before the organic EL layer 28 is formed, a decrease in thickness of the interlayer insulating film 24 that is an organic substance in the non-display region 12, caused by the UV ozone treatment, can be prevented by arranging the protective film 26a below the second opening 27a of the inorganic insulating film 27 in the non-display region 12.

In the present preferred embodiment, it is preferable that the protective film is composed of the same material as used for the first electrode in order to simplify the production processes. An ITO film that is a transparent conductive film is used in the present preferred embodiment in which the bottom-emission structure is used. In this case, moisture contained in the interlayer insulating film 24 is released out of the openings of the inorganic insulating film 27 through the ITO film that is a protective film 26a on the interlayer insulating film 24. According to the present preferred embodiment, the first electrode 26 and the protective film 26a are formed into the same pattern, and thereby the protective film 26a is formed to be slightly larger than the second opening 27a of the inorganic insulating film 27. As a result, moisture can be effectively removed from the portion where the protective film 26a is not formed on the interlayer insulating film 24.

According to the present preferred embodiment, the second opening 27a of the inorganic insulating film and the opening of the inorganic insulating film 27 in the pixel portion of the display region 11 have almost the same size, and the protective film 26a and the first electrode 26 have almost the same size. Therefore, the interlayer insulating film 24 in the display region 11 and that the non-display region 12 can be dehydrated almost uniformly.

In the present preferred embodiment, the protective films 26a are simultaneously formed by patterning when the first electrode 26 is formed by patterning. As mentioned above, the first electrode 26 and the protective film 26a have almost the same size. In the display region 11, the pattern density of the ITO film is the same between the center and the periphery. Therefore, the ITO film can be more uniformly patterned.

Further, according to the present preferred embodiment, the first electrode 26 in the display region 11 is not provided with the connection portion 26b, but the protective film 26a in the non-display region 12 is provided with the connection portion 26b. Accordingly, the boundary between the display region 11 and the non-display region 12 can be easily observed after the process of forming the first electrode 26 by patterning. Therefore, in the following processes of forming the organic EL element and the second electrode, it can be easily observed by eyes whether the organic EL element and the second electrode 29 can be surely formed in the display region 11.

The bottom-emission structure is preferably used in the present preferred embodiment, but the present invention is not limited thereto. The top-emission structure may be used. If the top-emission structure is used, the first electrode 26 is an electrode with reflectivity, and the second electrode is an electrode with translucency. Also in this case, in the non-display region 12, a film composed of the same material as used for the first electrode 26 can be formed as the protective film 26a. Only a film composed of the same material as used for the transparent conductive film that is the first electrode 26 may be formed as the protective film 26a if the first electrode 26 in the top-emission structure has a multilayer structure of a metal film with reflectivity and a transparent conductive film.

The present application claims priority under the Paris Convention and the domestic law in the country to be entered into national phase on Patent Application No. 2005-350640 filed in Japan on Dec. 5, 2005, and Patent Application No. 2006-313161 filed in Japan on Nov. 20, 2006, the entire contents of which are hereby incorporated by reference.

The terms "or more" and "or less" in the present description mean that the described value is included.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An organic electroluminescent panel comprising:
a substrate including an organic insulating film located on a surface thereof;
a first electrode, an organic layer including at least a light-emitting layer, and a second electrode, stacked in this order on the surface of the substrate on which the organic insulating film is located; and
an inorganic insulating film arranged to cover the organic insulating film and the first electrode; wherein
the inorganic insulating film includes an opening in a display region and an opening in a non-display region;
the non-display region includes a first region that includes the inorganic insulating film and a second region that does not include the inorganic insulating film;
the opening in the display region is located on the first electrode; and
the opening in the display region and the opening in the non-display region do not include one or more conductors arranged to electrically connect an overlaying layer of the inorganic insulating film to an external circuit.

2. The organic electroluminescent panel according to claim 1, wherein an area of the opening of the inorganic insulating film in the non-display region accounts for about 10% or more relative to an area of a region where the organic insulating film is located in the non-display region.

3. The organic electroluminescent panel according to claim 1, wherein the organic electroluminescent panel further comprises a protective film, and at least a portion of the protective film is located below the opening of the inorganic insulating film in the non-display region.

4. The organic electroluminescent panel according to claim 3, wherein the non-display region of the inorganic insulating film includes a plurality of openings, the protective film is located below each one of the plurality of openings in the non-display region of the inorganic insulating film to cover portions of the organic insulating film.

5. The organic electroluminescent panel according to claim 3, wherein the protective film has an opening.

6. The organic electroluminescent panel according to claim 3, wherein the protective film includes the same material as used for the first electrode.

7. The organic electroluminescent panel according to claim 3, wherein the protective film includes a plurality of conductive portions electrically connected to each other.

8. The organic electroluminescent panel according to claim 7, wherein the protective film is maintained at a constant potential.

9. The organic electroluminescent panel according to claim 3, wherein the protective film is electrically connected to the second electrode.

10. The organic electroluminescent panel according to claim 1, wherein the substrate on which an organic electroluminescent element is located is attached to a sealing member with an adhesive material arranged on an outer circumference of the organic electroluminescent panel, and the organic insulating film is not located below the adhesive material.

11. The organic electroluminescent panel according to claim 10, wherein a drying agent is arranged to face an airtight space located between the substrate on which the organic electroluminescent element is located and the sealing member.

12. An organic electroluminescent display device comprising the organic electroluminescent panel of claim 1.

* * * * *